(12) United States Patent
Kobata

(10) Patent No.: US 8,125,363 B2
(45) Date of Patent: Feb. 28, 2012

(54) DIGITAL SIGNAL PROCESSING DEVICE

(75) Inventor: Tsukasa Kobata, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 143 days.

(21) Appl. No.: 12/798,509

(22) Filed: Apr. 6, 2010

(65) Prior Publication Data

US 2010/0259425 A1    Oct. 14, 2010

(30) Foreign Application Priority Data

Apr. 8, 2009    (JP) .................... 2009-094339

(51) Int. Cl.
*H03M 1/66*    (2006.01)
(52) U.S. Cl. ....................... 341/147; 708/271
(58) Field of Classification Search .................. 341/147, 341/115, 117; 708/270, 271, 272, 273, 274, 708/275, 276, 277; 375/224, 226; 327/105; 455/76, 71
See application file for complete search history.

(56) References Cited

U.S. PATENT DOCUMENTS 7,421,464 B2 *    9/2008    Gradishar et al. ............ 708/271

FOREIGN PATENT DOCUMENTS

JP    2000-252750    9/2000

\* cited by examiner

*Primary Examiner* — Joseph Lauture
(74) *Attorney, Agent, or Firm* — Jordan and Hamburg LLP

(57) ABSTRACT

There is provided a digital signal processing device capable of suppressing occurrence of an unnecessary frequency component (spurious) in performing a reduction processing of a bit number of a frequency signal made of a digital signal. A signal output section 10 outputs a frequency signal by a digital signal made of bit data and an addition section 16 adds noise data for suppressing occurrence of an unnecessary frequency component to the bit data. A reduction processing section 11 performs a predetermined processing in correspondence with whether the bit data obtained in the addition section 16 is positive or negative, and thereafter, shifts each bit of the bit data to the right by m digits set in advance (m is an integer smaller than a bit number of the bit data) and cut off an m-bit portion to reduce the number, rounding down "0" and rounding up "1" for the most significant bit of the bits having been cut off.

3 Claims, 8 Drawing Sheets

REDUCTION PROCESSING FOR POSITIVE BIT DATA (a)

(b)

REDUCTION PROCESSING FOR NEGATIVE BIT DATA (a)

(b)

(WORKING EXAMPLE)

(COMPARISON EXAMPLE)

DIGITAL SIGNAL PROCESSING DEVICE

BACKGROUND OF THE INVENTION

1. Field of the Invention

The present invention relates to a technology of performing a processing to reduce a bit number to a frequency signal made of a digital signal outputted from a DDS (Direct Digital Synthesizer) or the like.

2. Description of the Related Art

In a device outputting an analog frequency signal based on a digital signal (bit data) generated in a signal generation section, such as a DDS and a digital audio player, sometimes a bit number of a signal processable in a digital/analog (D/A) conversion circuit is smaller than a bit number of a digital signal generated in the device for example. In such a case, it is necessary to perform a processing (hereinafter, referred to as a reduction processing) to reduce the bit number to the digital signal having been generated by the signal generation section.

In reduction of a bit number as above, multiplying an n-bit digital signal by "$2^{-m}$ (m<n)" for example enables the bit number to be reduced by m bits.

Here, the present inventor performs a frequency analysis of digital signals before and after performing a reduction processing of a bit number in a series of analyses to pursue improvement of a performance of a DDS, and confirms that an unnecessary frequency component (spurious) which has not been found before the reduction processing occurs in the digital signal after the reduction processing. Such a spurious is maintained also after an analog conversion and causes deterioration of a characteristic of a device.

Here, though there is described in Patent Document 1 a technology to suppress occurrence of a spurious of a frequency signal by adding noise data to make an ensemble mean zero to a cumulative addition section exit of a DDS at a random timing, no attention is paid to a spurious which occurs in reducing a bit number of a digital signal having been generated in DDS. Further, if a method described in Patent Document 1 is adopted and waveform data of the DDS is outputted to an A/D conversion section, it is anticipated that a floor noise or a phase noise increases.

[Patent Document]

[Patent Document 1] Japanese Patent Application Laid-open No. 2000-252750: paragraph 0024 to paragraph 0029, FIG. 1

SUMMARY OF THE INVENTION

The present invention is made base on such a background, and an object thereof is to provide a digital signal processing device capable of suppressing occurrence of an unnecessary frequency component (spurious) in performing a reduction processing of a bit number of a frequency signal made of a digital signal.

A digital signal processing device according to the present invention includes:

a signal output section outputting a frequency signal by a digital signal made of bit data;

an addition section adding noise data to the bit data from the signal output section to suppress occurrence of an unnecessary frequency component; and a bit number reduction processing section performing number reduction to the bit data obtained by the addition section by cutting off an m-bit portion after shifting each bit of bit data in a state of the following (1) or (2):

(1) if the bit data has a positive value, in a state as it is (2) if the bit data has a negative value, in a state after deduction of "1"

to the right by m digits set in advance (m is an integer smaller than a bit number of the bit data) and rounding down "0" and rounding up "1" for the most significant bit of the bits having been cut off.

The digital signal processing device can include the following characteristics:

(a) a digital/analog conversion section is provided in a subsequent stage of the bit number reduction processing section; and (b) the frequency signal is a sine wave.

In the present invention, in reducing a bit number of a digital signal for creating a frequency signal, a noise data is added to the digital signal before number reduction and then the bit number is reduced, a fraction processing (corresponding to rounding-off of a decimal number) of what is called rounding down "0" and rounding up "1" for the most significant bit of the bits to be cut off being performed. By performing such a processing, as will be obvious from a later-described working example, occurrence of a spurious in a frequency signal after a bit number reduction can be suppressed compared with a case of reducing a bit number without performing neither addition of noise data nor the above-described fraction processing, so that a highly reliable frequency signal can be generated.

DETAILED DESCRIPTION OF THE PREFERRED EMBODIMENT(S)

Figure 2:
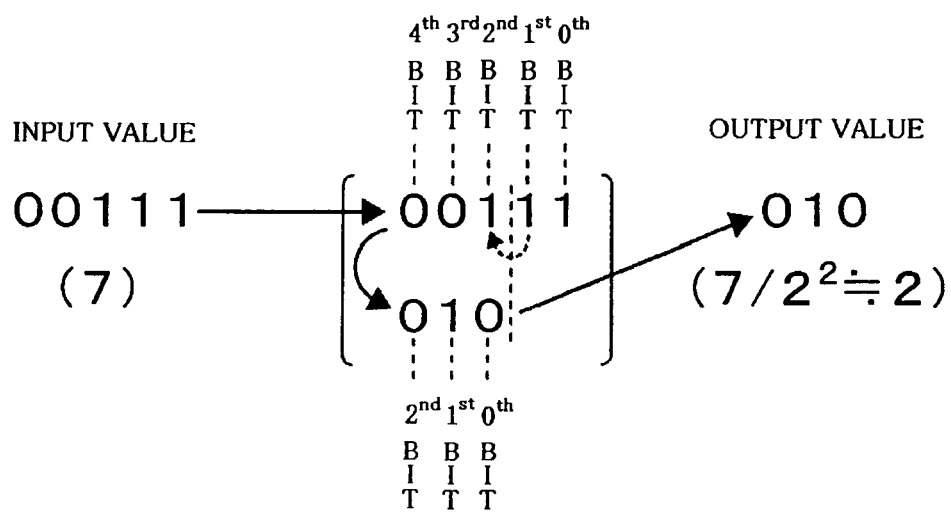
FIG. 2 is a first explanatory diagram showing a content of a processing performed in a reduction processing section of the digital signal processing device.
Figure 2:
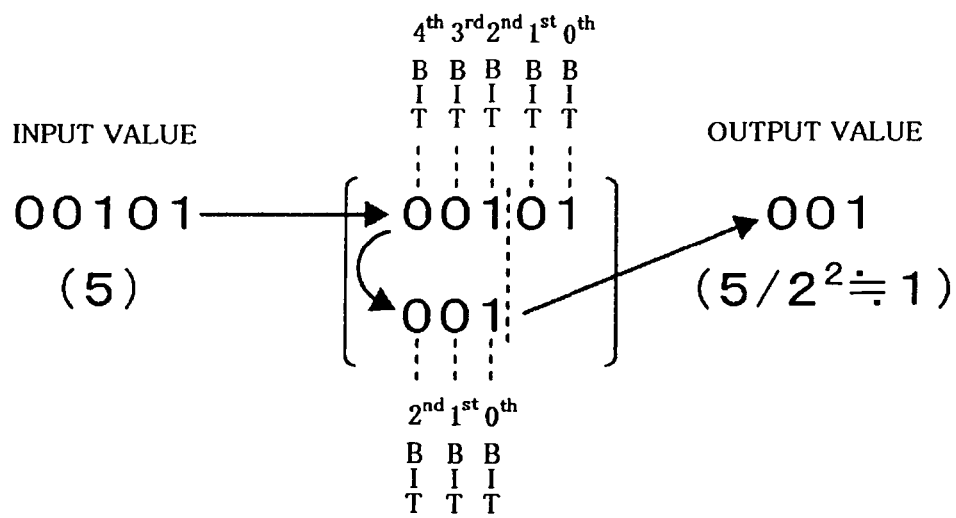
Figure 3:
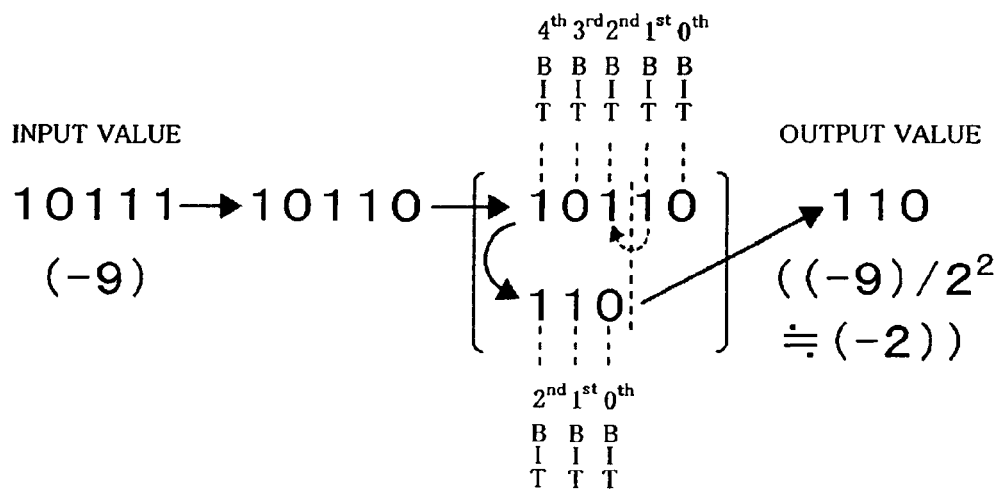
FIG. 3 is a second explanatory diagram showing the content of the processing performed in the reduction processing section.
Figure 3:
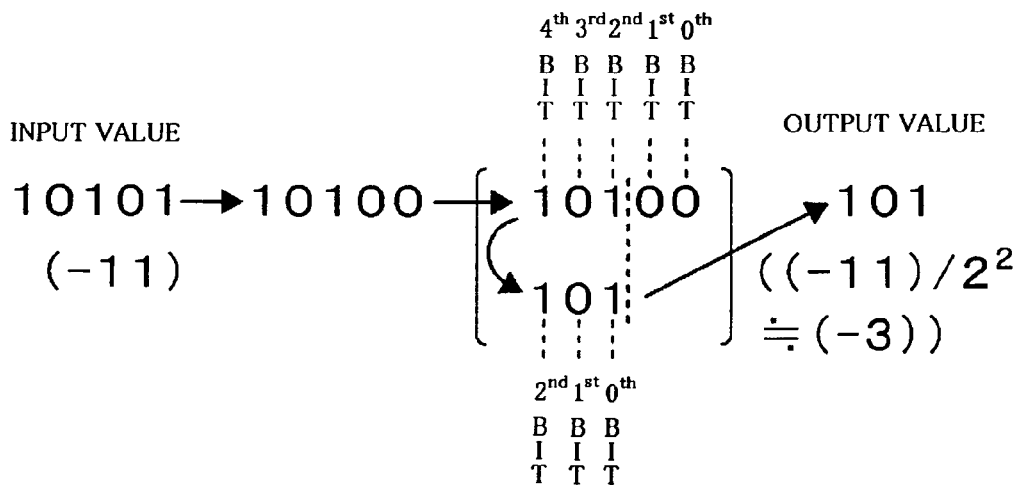

First, a configuration and an operation of a digital signal processing device according to the present embodiment will be described with reference to FIG. 1 to FIG. 3. As shown in a block diagram of FIG. 1, the digital signal processing device has an output section 10 being a signal output section of the present embodiment which outputs digital signals made of bit data as frequency signals in chronological order, a first addition section 16 adding noise data to the digital signal outputted from the output section 10, a reduction processing section 11 reducing a bit number of the digital signal after the noise data is added, and a D/A (digital/analog) conversion section 17 converting the digital signal after a reduction processing into an analog signal and outputting the analog signal.

In the present example, there will be described a case in which the digital signal processing device shown in FIG. 1 adds noise data to a signed 26-bit digital signal outputted from the output section 10 to make the digital signal be 27-bit in the first addition section 16 and subsequently performs a reduction processing in the reduction processing section 11 by cutting off a 13-bit portion to make the digital signal be 14-bit.

The first addition section 16 fulfills a role of suppressing a spurious occurring in a reduction processing by adding noise data to a digital signal outputted from the output section 10 before performing the reduction processing. As noise data inputted to the first addition section 16, a white noise such as a pseudo random pulse signal generated by a digital processing for example is used. In a case in which the digital signal processing device is provided between an output section of a digital signal and a D/A conversion section of a DDS for example, a white noise with a frequency band lower than a center frequency of a frequency signal generated in the DDS or, in contrast, a white noise with a frequency band higher than the center frequency can be used as noise data for example. As an example, there can be considered a case in which a frequency band of a noise is 1 MHz band when a center frequency of a frequency signal is 10 MHz.

Figure 1:
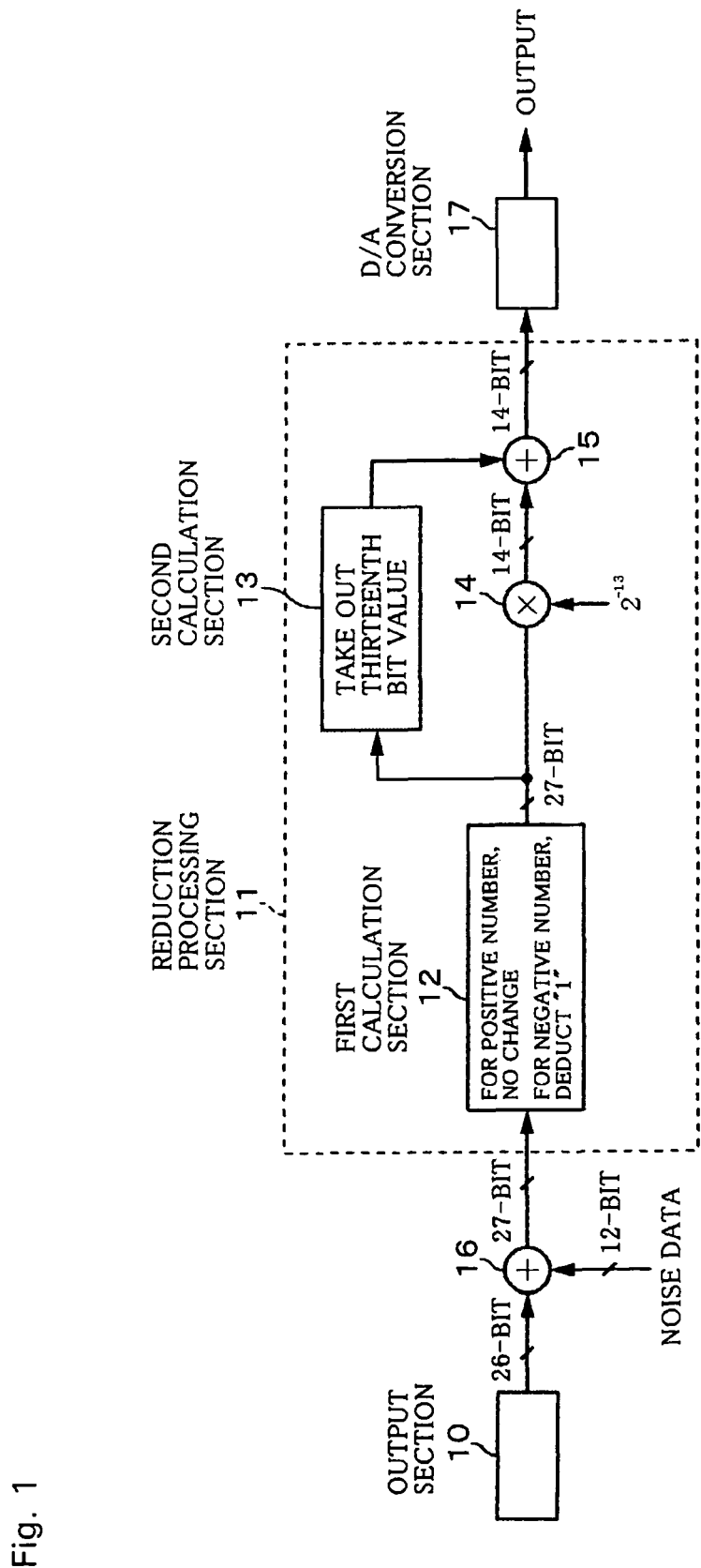
FIG. 1 is a block diagram showing a configuration of a digital signal processing device according to an embodiment.

In the first addition section 16 shown in FIG. 1, 12-bit noise data for example is added to a 26-bit signed digital signal outputted from the output section 10, and the signal is outputted as a 27-bit digital signal to the reduction processing section 11.

The reduction processing section 11 is constituted by a FPGA (Filed Programmable Gate Array) or the like for example, and fulfills a role of cutting off a 13-bit portion for example of bit data of a digital signal to which noise data has been added and of performing a reduction processing in which a later-described fraction processing is performed. The reduction processing section 11 has first and second calculation sections 12, 13, a multiplication section 14, and a second addition section 15. The first calculation section 12 has a function of judging whether a digital signal outputted from the first addition section 16 is a positive number or a negative number, to output the signal as it is in a case of the positive number and to output a number made by subtracting "1" from the signal in a case of the negative number.

The second calculation section 13 fulfils a role of taking out the most significant bit of the bits to be cut off from a digital signal outputted from the first calculation section 12. For example, in a case in which a signed 14-bit digital signal is obtained by cutting off a lower-order 13-bit portion of a signed 27-bit digital signal similarly to in the present example, a value of the thirteenth digit from the least significant bit is taken out as the most significant bit. Describing generally the above, in a case in which a bit number of a signed n-bit digital signal is cut off by an m-bit portion, a value of the m-th bit from the least significant bit is taken out.

Meanwhile, the multiplication section 14 fulfils a role of performing a calculation of multiplying a digital signal outputted from the first calculation section 12 by "$2^{-(13)}$", shifting each bit of the 27-bit digital signal to the right by 13 digits to cut off the 13-bit portion thereby reducing the digital signal to 14-bit bit data. Describing generally the above, a multiplication of "$2^{-m}$" is performed to an n-bit digital signal and an (n-m)-bit digital signal is obtained.

By adding an output of the multiplication section 14 and an output of the second calculation section 13, the second addition section 15 fulfils a role of performing a fraction processing (corresponding to rounding-off of a decimal number) of what is called rounding down "0" and rounding up "1" for the most significant bit of the bits to be cut off.

A content of a signal processing performed in the reduction processing section 11 having the above configuration will be described about a case in which 5-digit (n=5) bit data is reduced to 3-digit (m=3) bit data for example, a digit number of a signed digital signal being made small for the sake of simplicity. For example, as shown in FIG. 2(a), when a digital signal made of positive bit data "00111" ("7" of a decimal number) is inputted to the first calculation section 12, the first calculation section 12 outputs this signal as it is to a subsequent stage since the signal is positive.

The second calculation section 13 takes out a first bit "1" being the most significant bit of two digits (m=2) to be cut off of the digital signal obtained from the first calculation section 12, while the multiplication section 14 performs a multiplication of "00111" by "$2^{-2}$" and obtains "001". Then, these values are added in the second addition section 15 and a 3-bit digital signal "010" is outputted to a subsequent stage. The digital signal "010" corresponds to "2" in a decimal number and coincides with "2" being a result of rounding-off of a value "1.75" obtained by multiplying the input value "7" by "$2^{-2}$" (dividing by "$2^2$").

Further, FIG. 2(b) shows a processing performed to "00101" (corresponding to "5" in a decimal number) for example in the reduction processing section 11 in a case in which the most significant bit (first bit) of 2 digits to be cut off is "0" in a similar example to the example of FIG. 2(a) where a 5-digit (n=5) digital signal is reduced by two bits (m=2). In also this case, a digital signal "001" (corresponding to "1" in a decimal number) having been processed in the reduction processing section 11 coincides with "1" being a result of rounding-off a value "1.25" made by multiplying "5" being an input value by "$2^{-2}$" (dividing by "$2^2$").

Next, a processing of a digital signal made of negative bit data "10111" (corresponding to "−9" in a decimal number) will be described with reference to FIG. 2(a). Since this signal is negative, the first calculation section 12 outputs bit data "10110" made by deducting "1" from this signal to a subsequent stage.

The second calculation section 13 takes out a value "1" of a first bit being the most significant bit of 2 digits to be cut off of the digital signal obtained from the first calculation section 12, while the multiplication section 14 performs a multiplication of "10110" by "$2^{-2}$", thereby obtaining "101". Then, these values are added in the second addition section 15 and outputted as a 3-bit digital signal "110" to the subsequent stage. This digital signal "110" corresponds to "−2" in a decimal number and coincides with "−2" being a result of rounding-off of a value "−2.25" made by multiplying "−9" being an input value by "$2^{-2}$" (dividing by "$2^2$").

Further, FIG. 3(b) shows a processing performed in the reduction processing section 11 to "10101" (corresponding to "−11" in a decimal number) for example in the reduction processing section 11 in a case in which the most significant bit (first bit) of 2 digits to be cut off is "0" in an example similar to the example of FIG. 3(a). In also this case, a digital signal "101" (corresponding to "−3" in a decimal number) processed in the reduction processing section 11 coincides with "−3" being a result of rounding-off of a value "−2.75" made by multiplying "−11" being an input value by "$2^{-2}$" (dividing by "$2^2$").

Figure 4:
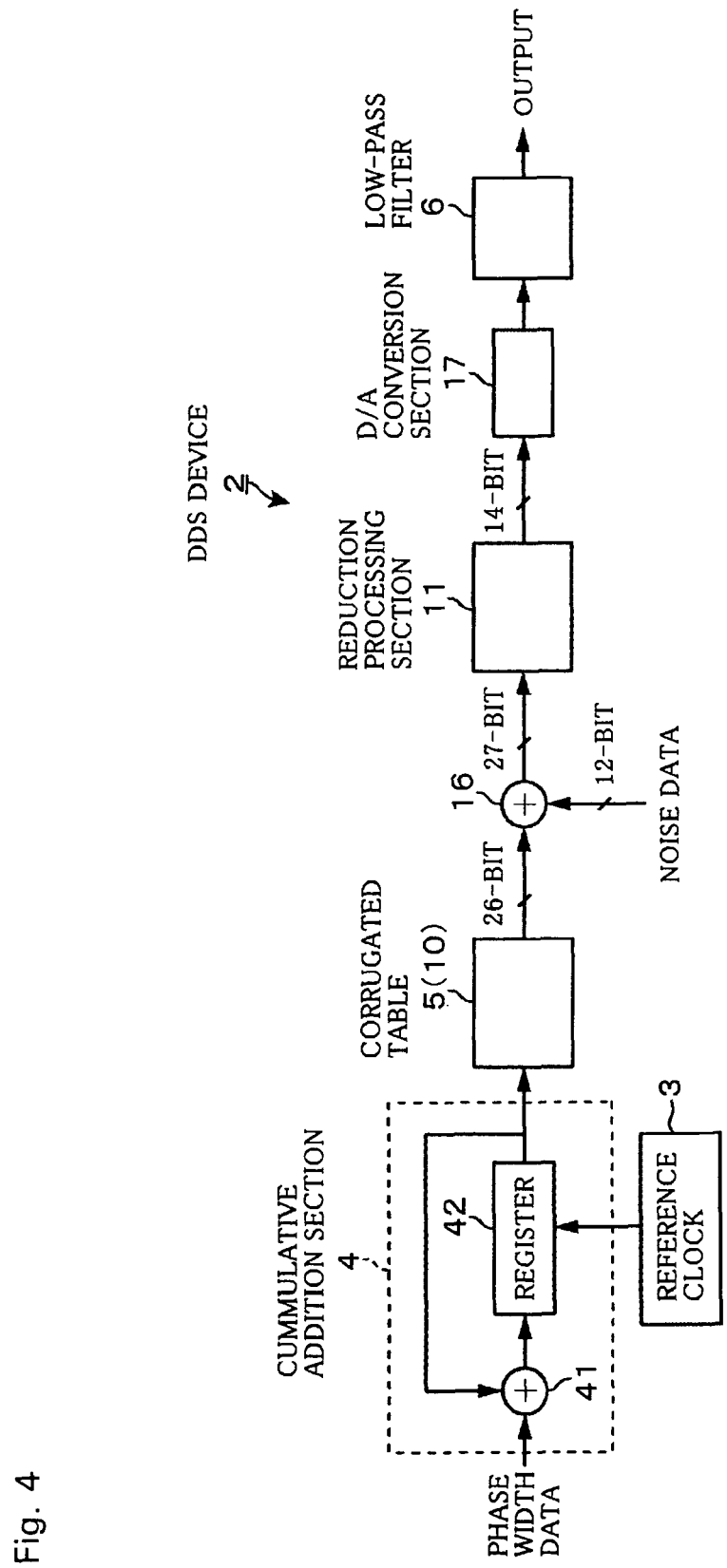
FIG. 4 is a block diagram showing a configuration of a DDS device having the digital signal processing device.

The digital signal outputted from the reduction processing section 11 is converted into an analog signal in the D/A conversion section and outputted as an analog frequency signal. It is empirically confirmed as shown in a later-described working example that a frequency signal obtained by performing a reduction processing after adding noise data to a digital signal and by performing a fraction processing corresponding to rounding-off of a decimal number at a time of the reduction processing as described above suppresses a spurious which occurs at a time of a reduction processing. Hereinafter, an embodiment in which the above-described digital signal processing device is applied to a DDS device 2 will be described with reference to FIG. 4.

The DDS device 2 according to the present embodiment has a structure in which the digital signal processing device described by using FIG. 1 is provided between a corrugated table 5 and a D/A conversion section 17 in a known DDS device. More detailedly, the DDS device 2 has a cumulative addition section 4 from which phase data is outputted in correspondence with an input timing of a clock signal from a reference clock generation section 3, and the corrugated table 5 which stores amplitude data of a sine wave in correspondence with the phase data and which outputs, based on phase data outputted from the cumulative addition section 4, amplitude data corresponding thereto. In a subsequent stage of the corrugated table, there are connected in series a first addition section 16, a reduction processing section 11, and a D/A conversion section 17 similar to those explained in FIG. 1, and in an exit side of the D/A conversion section 17, there is provided a low-pass filter 6 removing a clock component of analog data having been D/A converted in the conversion section 17.

The cumulative addition section 4 has a register 42 outputting a value held therein in synchronization with an input timing of a clock signal from the reference clock generation section 3, and an addition section 41 adding an increment (phase width data) of a phase per clock to an output from the register 42 and overwriting a result thereof to the register 42, and fulfils a role of reading data held one clock cycle before per input timing of a clock signal to output the data to the corrugated table 5 and cumulatively adding the phase width data to hold the cumulatively added phase width data in the register 42.

The corrugated table 5, which has a table in which amplitude data of a sine wave is stored in correspondence with phase data, reads the amplitude data from the table by using phase data outputted from the cumulative addition section 4 as an address and outputs the amplitude data as a 26-bit signed digital signal for example. As stated above, since the corrugated table 5 outputs amplitude data based on phase data obtained by cumulatively adding phase data in the cumulative addition section 4, a low-frequency digital signal is outputted from the corrugated table 5 when a range of the phase data is small, and a high-frequency digital signal is outputted when the range of the phase data is large. The corrugated table 5 is thus capable of outputting a digital signal having a desired frequency and the corrugated table 5 corresponds to the output section 10 of the digital signal processing device according to the embodiment provided in the DDS2.

The first addition section 16, the reduction processing section 11, and the D/A conversion section 17 which comprise the digital signal processing device, as described by using FIG. 1, add noise data to the digital signal outputted from the corrugated table 5 (output section 10), performs a reduction processing involving the aforementioned fraction processing, and makes the digital signal be a 14-bit digital signal, and then converts the 14-bit digital signal into an analog signal. Then, a clock component is removed from this analog data in the low-pass filter 6 to make a sine wave, and then the sine wave is outputted.

The DDS device 2 having the digital signal processing device according to the present embodiment has the following effect. In performing a reduction processing to reduce a bit number of a digital signal for creating a frequency signal, noise data is added to a digital signal before reduction and then the bit number is reduced, performing a fraction processing (corresponding to rounding-off of a decimal number) in which what is called rounding down "0" and rounding up "1" of the most significant bit to be cut off is performed. By performing such a processing, as will be obvious from a later-described working example, occurrence of a spurious in the frequency signal can be suppressed compared with a case in which a bit number is reduced without adding noise data and without performing a fraction processing, so that a highly reliable frequency signal can be generated.

Here, a device capable of suppressing occurrence of a spurious by applying a digital signal processing device according to the present embodiment is not limited to the example of the already-described DDS device 2. For example, in also a case in which a reduction processing is performed to a digital signal inputted to a D/A conversion section of a digital audio device or the like, occurrence of a spurious based on reduction of a bit number can be suppressed by providing the digital signal processing device shown in FIG. 1 between a calculation processing section and the D/A conversion section of the digital audio device. Further, the present invention can be applied to a device outputting a reference frequency at a time of controlling a phase of a frequency signal.

WORKING EXAMPLE

After a signed 26-bit (n=26) digital signal obtained by sampling a sine wave of 15.714733 MHz at a 40 MHz cycle is reduced to obtain a signed 14-bit digital signal, a frequency analysis of the digital signals before and after a reduction processing is performed.

A. Experimental Condition

Working Example

Figure 5:
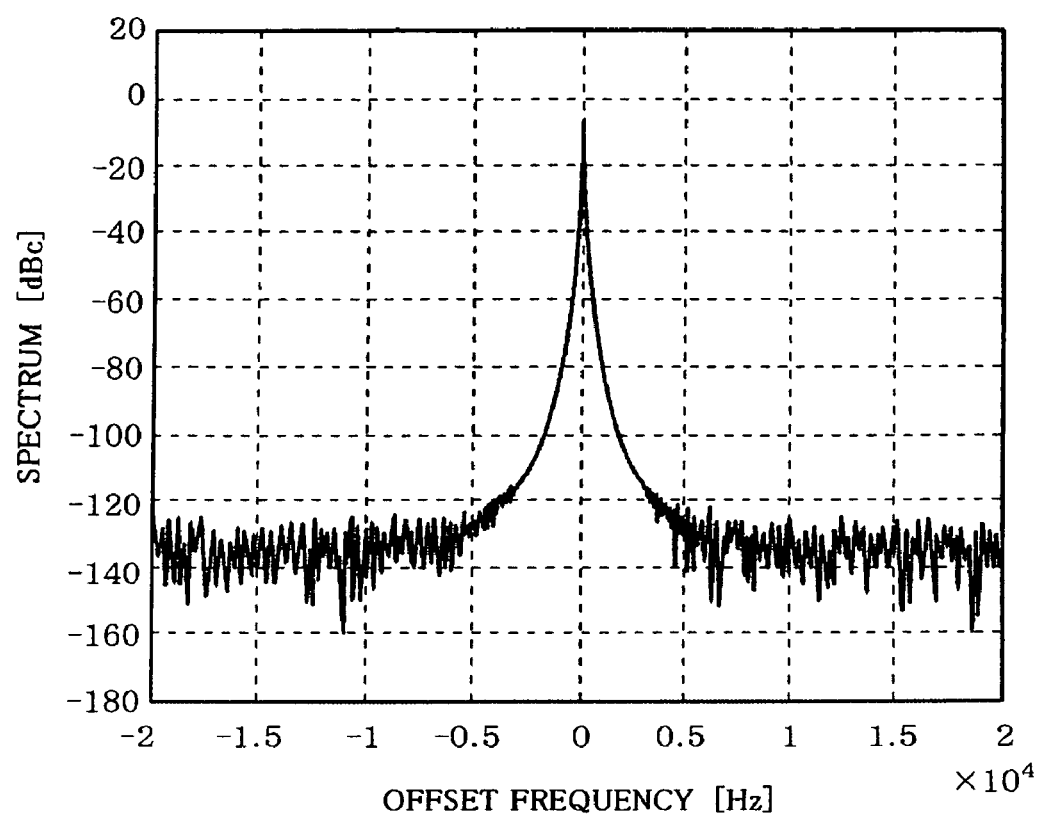
FIG. 5 is a spectral view of an input signal inputted in digital signal processing devices according to a working example and a comparative example.
Figure 6:
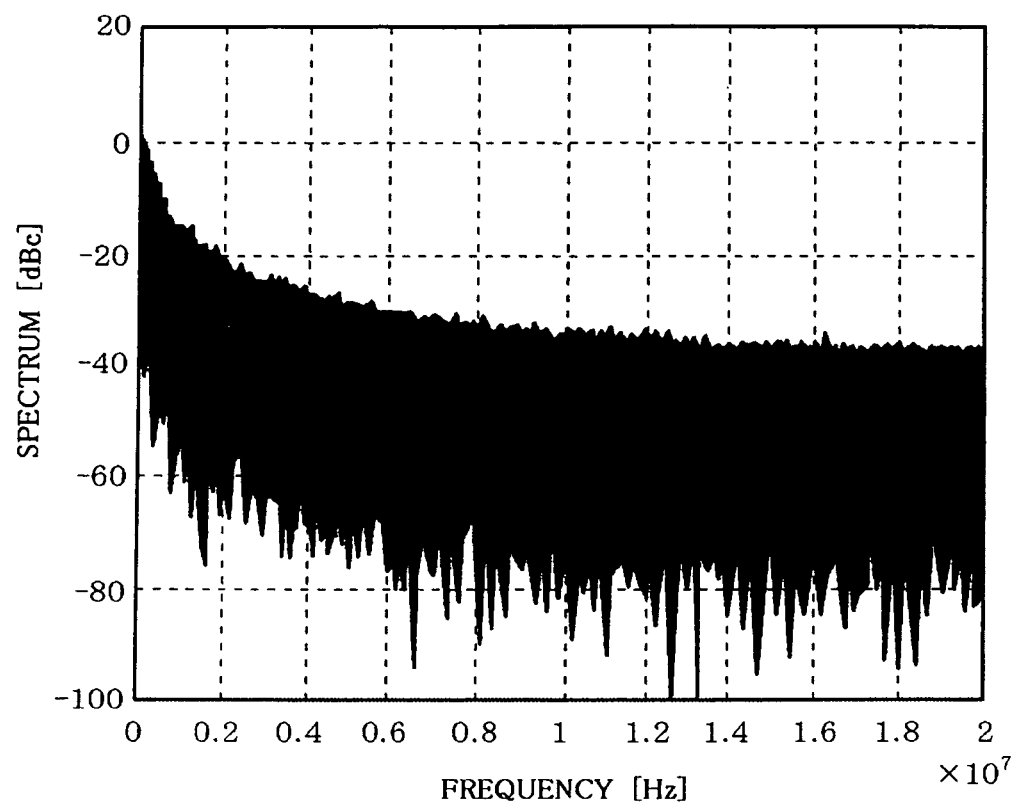
FIG. 6 is a spectral view of noise data inputted in the digital signal processing device according to the working example.

After a 27-bit digital signal is obtained by adding 12-bit noise data shown in FIG. 6 to a 26-bit digital signal having a spectrum shown in FIG. 5, there is performed a postprocessing in which a multiplication by "$2^{-13}$" and a fraction processing of rounding down "0" and rounding up "1" for the most significant bit of a 13-bit portion to be cut off are performed, thereby obtaining a 14-bit digital signal. A horizontal axis of FIG. 5 indicates an offset frequency [$\times 10^4$ Hz] being a frequency of a difference from a carrier frequency 15.714733 MHz, while a vertical axis indicates a ratio [dBc] to a level of the carrier frequency. Further, a horizontal axis of FIG. 6 indicates a frequency [$\times 10^7$ Hz] of noise data, while a vertical axis indicates a ratio [dBc] to a level of a carrier frequency.

Comparison Example

Addition of noise data is not performed to a 26-bit (n=26) digital signal having a spectrum shown in FIG. 5 and a fraction processing (m=12) of cutting off the most significant bit to be cut off in every case, thereby obtaining a 14-bit digital signal.

B. Experimental Result

Figure 7:
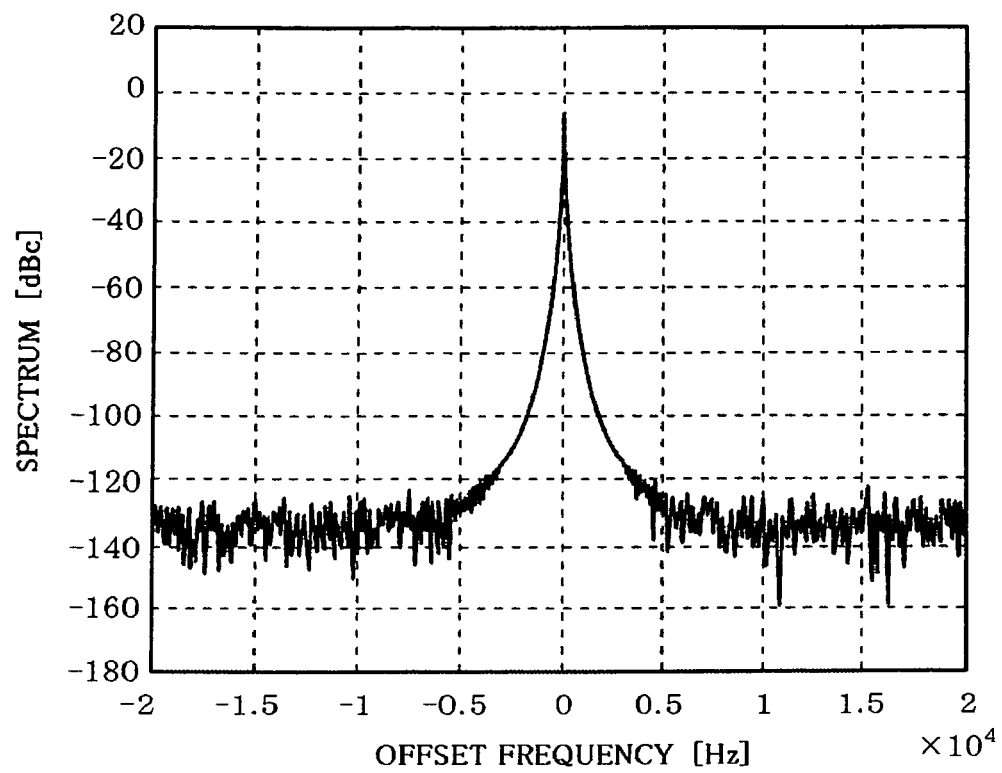
FIG. 7 is a spectral view showing a result of the working example.
Figure 8:
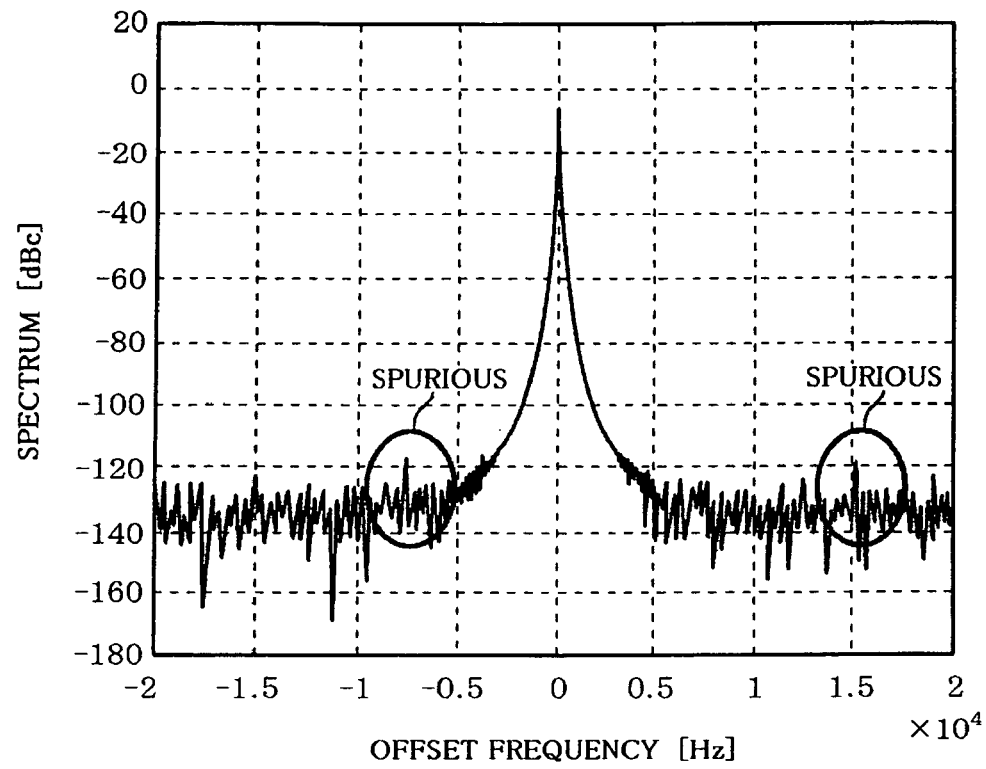
FIG. 8 is a spectral view showing a result of the comparative example.

A result of (Working Example) is shown in FIG. 7, while a result of "Comparison Example" is shown in FIG. 8. A horizontal axis and a vertical axis of each drawing are similar to those in FIG. 5.

According to the result of (Working Example) shown in FIG. 7, occurrence of a new spurious is not confirmed compared with a result of the frequency analysis of the 26-bit digital signal shown in FIG. 5 before performing the reduction processing.

In comparison, according to the result of (Comparison Example) shown in FIG. 8, occurrence of spuriouses whose ratio to a carrier frequency is of about −120 [dBc] is confirmed in a position of −7.5 kHz from the carrier frequency and in a position of +15 kHz from the carrier frequency which are shown surrounded by circles in FIG. 8.

According to these results, it can be confirmed that compared with (Comparison Result) in which neither addition of noise data nor a fraction processing of what is called rounding down "0" and rounding up "1" is performed, occurrence of a spurious after a reduction processing can be suppressed in (Working Example), in which the above postprocessing is performed.

What is claimed is:

1. A digital signal processing device comprising:
   a signal output section outputting a frequency signal by a digital signal made of bit data;
   an addition section adding noise data to the bit data from the signal output section to suppress occurrence of an unnecessary frequency component; and
   a bit number reduction processing section performing number reduction to the bit data obtained by said addition section by pre-processing the obtained bit data and cutting off an m-bit portion after the pre-processing:
   wherein when the obtained bit data has a negative value, the pre-processing includes subtracting a value "1" from the obtained bit data; wherein when the obtained bit data has a positive value, the pre-processing leaves the obtained bit data "as is"; and wherein the pre-processed obtained bit data undergoes shifting to the right by m digits set in advance to cut-off the m-bit portion where m is an integer less than a number of bits of the obtained bit data, and then undergoes fraction processing to adjust a least significant bit according to either one of rounding down "0" or rounding up "1" of a most significant bit of the bits having been cut off.

2. The digital signal processing device according to claim 1, wherein a digital/analog conversion section is provided in a subsequent stage of said bit number reduction processing section.

3. The digital signal processing device according to claim 1, wherein the frequency signal is a sine wave.

* * * * *